United States Patent
Chauhan et al.

(10) Patent No.: US 10,361,695 B2
(45) Date of Patent: Jul. 23, 2019

(54) CURRENT SENSING AND CONTROL FOR A TRANSISTOR POWER SWITCH

(71) Applicant: TEXAS INSTRUMENTS INCORPORATED, Dallas, TX (US)

(72) Inventors: Ankur Chauhan, Karnataka (IN); Sudheer Prasad, Karnataka (IN); Md. Abidur Rahman, Richardson, TX (US); Subrato Roy, Karnataka (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 16/001,518

(22) Filed: Jun. 6, 2018

(65) Prior Publication Data

US 2018/0287602 A1 Oct. 4, 2018

Related U.S. Application Data

(62) Division of application No. 15/341,205, filed on Nov. 2, 2016, now Pat. No. 10,014,851.

(51) Int. Cl.
*H03K 3/00* (2006.01)
*H03K 17/082* (2006.01)
(Continued)

(52) U.S. Cl.
CPC ..... *H03K 17/0822* (2013.01); *G01R 19/0092* (2013.01); *H01L 23/5256* (2013.01);
(Continued)

(58) Field of Classification Search
CPC ............. H03K 17/0822; H03K 17/687; G01R 19/0092; H01L 23/5256
(Continued)

(56) References Cited

U.S. PATENT DOCUMENTS

| 9,838,003 B1* | 12/2017 | Prasad | H03K 17/22 |
| 2008/0169843 A1* | 7/2008 | Aipperspach | G11C 17/165 |
| | | | 327/51 |

(Continued)

FOREIGN PATENT DOCUMENTS

WO 2000060730 A1 10/2000

OTHER PUBLICATIONS

Jacek Korec and Chris Bull, "History of FET Technology and the Move to NexFET," Bodo's Power Systems, May 2009, pp. 44-46, Texas Instruments, accessed Nov. 2, 2016, http://www.ti.com/lit/ml/slpa007/slpa007.pdf.

*Primary Examiner* — Ryan Jager
(74) *Attorney, Agent, or Firm* — Lawrence J. Bassuk; Charles A. Brill; Frank D. Cimino (57) ABSTRACT

An apparatus includes: a first power transistor having a first current conduction path coupled between an input for receiving a supply voltage and a node and a first gate terminal coupled to a first gate control signal; a second power transistor having a second current conduction path coupled between the node and an output terminal for supplying a load current to a load; and a second gate terminal coupled to a second gate control signal; and a current sense transistor having a third gate terminal coupled to the first gate control signal, and outputting a sense current. The apparatus further includes: a differential amplifier having an output signal, and a feedback transistor having a gate terminal coupled to the output signal of the differential amplifier; and a resistor coupled between a monitor node and ground.

8 Claims, 8 Drawing Sheets

(51) Int. Cl.
  *G01R 19/00* (2006.01)
  *H01L 23/525* (2006.01)
  *H03K 17/687* (2006.01)

(52) U.S. Cl.
  CPC ... *H03K 17/687* (2013.01); *H03K 2217/0027* (2013.01); *H03K 2217/0054* (2013.01)

(58) Field of Classification Search
  USPC ......................................................... 327/109
  See application file for complete search history.

(56) References Cited

U.S. PATENT DOCUMENTS

| | | |
|---|---|---|
| 2009/0267587 A1 | 10/2009 | Tateno |
| 2012/0187930 A1 | 7/2012 | Williams |
| 2012/0281450 A1 | 11/2012 | Lee |
| 2014/0103963 A1 | 4/2014 | Chaware |
| 2014/0210523 A1 | 7/2014 | Geng |
| 2015/0015300 A1 | 1/2015 | Simonson |
| 2017/0060152 A1 | 3/2017 | Martini |
| 2018/0123578 A1* | 5/2018 | Chauhan ............ G01R 19/0092 |

* cited by examiner

CURRENT SENSING AND CONTROL FOR A TRANSISTOR POWER SWITCH

This application is a divisional of prior application Ser. No. 15/341,205, filed Nov. 2, 2016, now U.S. Pat. No. 10,014,851, issued Jul. 3, 2018.

TECHNICAL FIELD

This application relates generally to power switches and corresponding control circuits, and, in particular, to circuits to control a circuit including transistor power switches supplying current to a load.

BACKGROUND

E-fuse ("electronic fuse") circuits control a connection between an input voltage supply and a load coupled at an output terminal. The E-fuse can include a series power transistor that connects a load to an input power supply. For example, a circuit board may get its power from a bus. When the circuit board is inserted into the bus socket, contacts in the bus socket connect the board to power. E-fuses often provide: current over-limit controls; short-circuit protection; in-rush current limiting; dv/dt or start-up voltage ramp control; and reverse current protection. An E-fuse can reduce the available current to the load or even shut down the power supply connection to the load entirely when an overcurrent exists.

In an example application, a power transistor has a drain terminal coupled to a voltage supply and a source terminal coupled to a load at an output terminal. When providing power to the load at the output terminal, the gate of the power transistor needs to be at a sufficient voltage to turn on the power transistor to couple the load to the power supply. The current to the load is monitored using sensing circuitry. If the current flowing through the series power transistor exceeds a current limit, the gate voltage of the power transistor can be reduced to limit load current, or the gate voltage can be changed to cut off the power transistor. The turn off needs to happen before any physical damage to the power transistor can occur. The load current can exceed a current limit if a short to ground occurs at the output terminal or if a short occurs in a load circuit.

SUMMARY

In described examples, an apparatus includes: a first power transistor having a first current conduction path between a first current conduction terminal and a second current conduction terminal, the first current conduction path of the first power transistor coupled between an input for receiving a supply voltage and a node, the first power transistor having a first gate terminal for controlling the first power transistor coupled to a first gate control signal; a second power transistor having a second current conduction path between a third current conduction terminal and a fourth current conduction terminal, the second current conduction path of the second power transistor coupled between the node and an output terminal for supplying a load current to a load; the second power transistor having a second gate terminal coupled to a second gate control signal; and a current sense transistor having one current conduction terminal coupled to the node and the first power transistor, having a third gate terminal coupled to the first gate control signal, and outputting a sense current at another current conduction terminal. The apparatus further includes: a differential amplifier having a first input coupled to one of the first and second current conduction terminals of the first power transistor and having a second input coupled to the other one of the first and second current conduction terminals, and having an output signal responsive to a voltage difference between the first input and the second input; a feedback transistor having another current conduction path coupled in series between the current sense transistor and a monitor node, having a feedback transistor gate terminal coupled to the output of the differential amplifier; and a resistor coupled between the monitor node and ground, the sense current flowing through the resistor, the sense current being proportional to the load current flowing through the second power transistor.

DETAILED DESCRIPTION

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

Figure 1:
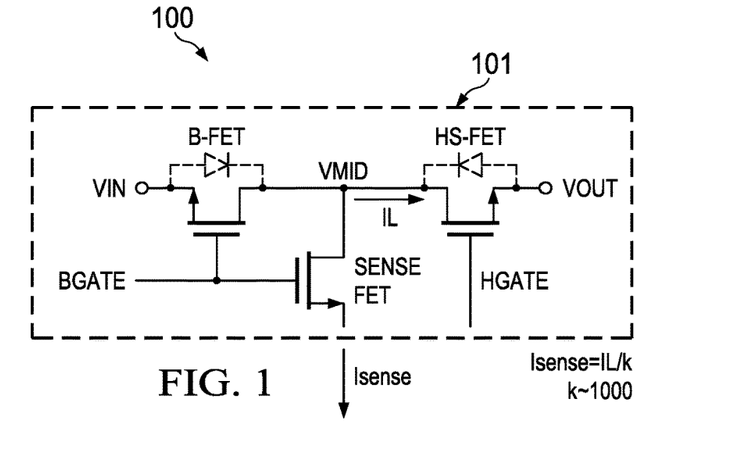
FIG. 1 is a circuit diagram of a power transistor circuit.

FIG. 1 is a diagram of a power circuit 100. Power circuit 100 includes a circuit 101 coupled between a power source terminal VIN and an output terminal VOUT. Circuit 101 is a power transistor circuit that can form a portion of an E-fuse circuit. A load (not shown in FIG. 1) that draws current will be coupled to the VOUT terminal. The high side transistor HS-FET serves as a switch between a power source VIN and the load coupled to terminal VOUT. A control circuit (not shown) is coupled to the gate terminal of the high side transistor HS-FET and supplies a gate control voltage HGATE. In the circuit 101, a blocking transistor B-FET is coupled between the node VMID and the input voltage VIN. The blocking transistor has a body diode (shown dashed to indicate that the body diode is an intrinsic device) between the source, coupled to the node VMID, and the drain, coupled to VIN, which prevents current from flowing from the output terminal VOUT to the input terminal VIN, which can be considered a "reverse" current. The gate of the blocking FET B-FET is coupled to a gate control voltage BGATE. BGATE is supplied from a control circuit (not shown).

In an application for supplying an output voltage from an input voltage, an E-fuse circuit including circuit 100 is arranged to protect the input power supply, the load device as well as the expensive FET devices from damage due to an over-current condition. By sensing the current flowing through the HS-FET, the control circuit in the E-Fuse can shut down the transistor HS-FET using the gate control signal HGATE. Limiting the current or shutting down the circuit is done to protect the HS-FET and the load.

In FIG. 1, circuit 101 includes a current sensing device SENSE FET. The current sensing device is coupled with the same gate voltage BGATE as the blocking device B-FET, and with the same voltage VMID at the drain terminal. Since the sense FET is on the same substrate and is built using the same semiconductor process as the blocking device B-FET, the current flowing through SENSE-FET should be proportional to the load current IL flowing through the blocking transistor B-FET. However, in practice in a conventional configuration such as shown in FIG. 1 the sense current "Isense" lacks sufficient accuracy, especially when the gate to source voltage (Vgs) is small. The lack of accuracy occurs because the threshold voltage for the SENSE FET (which is made much smaller in device size than the HS-FET and the blocking device B-FET) does not match the threshold voltage for the blocking transistor B-FET under all conditions.

An important aspect of circuit 101 is determined by current power FET technologies. Recently, the development of low resistance MOSFET devices made using vertical FET processes have resulted in increased circuit performance. These devices are rapidly replacing prior device types (such as bipolar transistors, lateral FETs such as DMOS FETS, and earlier conventional trench FETs) in power applications. An example advanced FET device is a NexFET™ technology device provided by Texas Instruments Incorporated, the owner of the present application. ("NexFET" is a trademark owned by Texas Instruments Incorporated for power MOSFETs). The NexFET™ devices have a very low on-resistance Rdson, have high device performance, are robust, are devices with relatively small silicon area, and these devices can carry very high voltages and currents, such as voltages up to 100 Volts. The embodiments can be implemented using the NexFET™ devices, using other power FET technologies, using vertical FETs and using other FET arrangements.

In FIG. 1, the power transistor circuit 101 can be implemented on a single semiconductor substrate including all of the FET devices. However, to form the devices in FIG. 1 in an efficient manner using a vertical FET, a common substrate node VMID is coupled to one terminal of the FET transistors. In FIG. 1, the drains of the three devices B-FET, HS-FET and SENSE FET in e-fuse 101 are all coupled to the substrate at node VMID. Because the drains are coupled to the substrate at the bottom of the vertical FET structure, this is referred to as a "drain-down" configuration. This common drain configuration limits the current sensing circuit arrangements that can be used. Additional improvements are therefore needed to improve the accuracy of the sensed current Isense over a wide range of conditions. The embodiments are applicable to arrangements formed with vertical FET devices.

Figure 2:
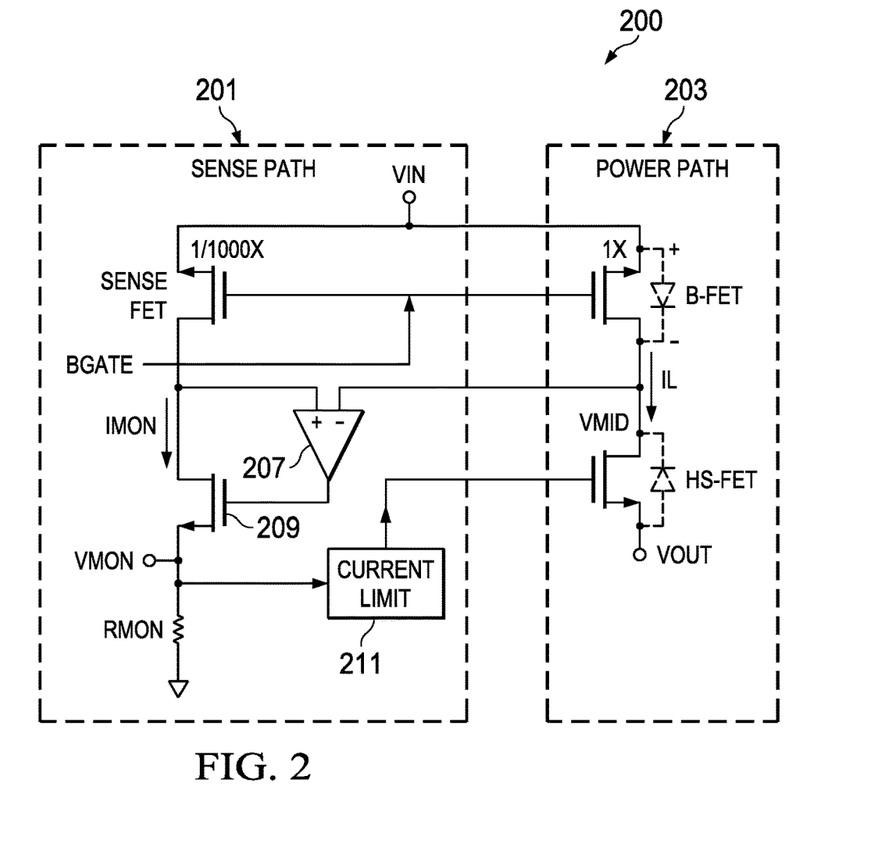
FIG. 2 is a circuit diagram of a conventional power transistor circuit including a current monitor and current limiting circuit.

A review of conventional FET current sensing approaches is now presented. FIG. 2 depicts a conventional power supply circuit 200 with current sensing and current limiting. Similarly labeled components in FIG. 2 perform similar functions as the elements of power circuit 100 (FIG. 1). For example, high-side device labelled HS-FET in FIG. 1 operates in the same manner as the high side device HS-FET in FIG. 2.

In FIG. 2, a current sensing path (labeled SENSE PATH) and numbered 201 is shown coupled in parallel to the power current path (labeled POWER PATH) numbered 203. In the sense path 201, the input voltage VIN is coupled to the source terminal of a sense transistor SENSE FET, which can be scaled (using device W/L area) to be smaller than the power FETs. Various scaling factors can be used. The drain of the SENSE FET is coupled to supply a current IMON (monitor current) to a feedback transistor 209. An operational amplifier (op-amp) 207 is coupled as a comparator. The output of the operational amplifier 207 changes in response to the difference in voltage at the positive and negative terminals. The drain of the sense transistor SENSE FET is coupled to the positive input terminal (shown as a "+" sign in FIG. 2) of the op-amp 207. The negative terminal (shown as a "−" sign in FIG. 2) of the op-amp 207 is coupled to the common drain terminal VMID between the blocking transistor B-FET and the high side transistor HS-FET. The high side transistor HS-FET carries the load current IL from the input voltage supply coupled at the node VIN to the output terminal VOUT and to a load (not shown for clarity) coupled to VOUT.

Op-amp 207 is coupled in a feedback configuration using the feedback transistor 209. A virtual ground condition exists at the inputs to the operational amplifier 207. In operation, the op-amp 207 will adjust the voltage at the gate of the feedback transistor 209 to keep the voltages at the positive and negative terminals (labeled "+" and "−" in FIG. 2) equal. The current IMON will then be proportional to the load current IL. The proportion will be determined by the scaling between the sense transistor SENSE-FET and the power transistors such as the HS-FET. In an example, the scaling is such that the sense current is $\frac{1}{1000}^{th}$ of the load current IL, however other scale factors can be used, and the magnitude of the sense current relative to the load current will change in correspondence with the scale factor.

In operation, current limit block 211 controls the high side transistor HS-FET. When the high side transistor HS-FET is delivering a current IL to the load, the drain-to-source voltage of the blocking transistor B-FET in the power path 203 will be equal to the drain-to-source voltage of the sensing transistor SENSE FET. If the drain voltages are not equal, the operational amplifier 207 will change the voltage at the gate of the feedback transistor 209 until the drain voltages are equal. By matching the devices SENSE FET and B-FET, the current flowing through the devices can be made proportional to the size ratio of the devices. This is true because the devices are matched, the source terminals of both devices are at the same potential (VIN, the input supply voltage), and the gate terminals are both tied to the same gate control voltage BGATE. When the two devices are carrying the same (proportional) current, the drain voltages will also be equal.

In FIG. 2, the current IMON provides an output voltage at a terminal VMON that can be used to control the power transistor circuit and to provide a current limit. The output terminal VMON can be used to control the current limit by providing a user determined value for the resistor RMON. By sizing the resistor RMON, a monitor voltage VMON can be developed that is proportional to the current IMON. The monitor voltage VMON can be observed by a current limit control block 211. The gate voltage signal HGATE coupled to the high side transistor HS-FET is output by the current limit block 211. When the voltage VMON exceeds a threshold or reference voltage, the current limit block 211 can limit or reduce the gate voltage HGATE and reduce, or even stop, the load current IL from flowing through the high side transistor HS-FET and to the load. Additional optional outputs can be created to give indicators that a current limiting situation is occurring for use by a user or by a controller in the system. The voltage VMON can be coupled to observe the current IMON flowing in the system, which is proportional to the load current IL.

The connections in circuit 200 require that the drain terminals of the sensing transistor SENSE FET and the drain terminals of the power transistors B-FET and HS-FET be physically separated. However, in vertical FET devices being produced for power applications (such as NexFET™ devices), the transistors on the power integrated circuit have one current carrying terminal (either the source or drain) coupled to a common substrate node, such as the node VMID shown in FIG. 1. Therefore, the conventional circuit 200 cannot be used to sense the current in these advanced power devices.

Figure 3:
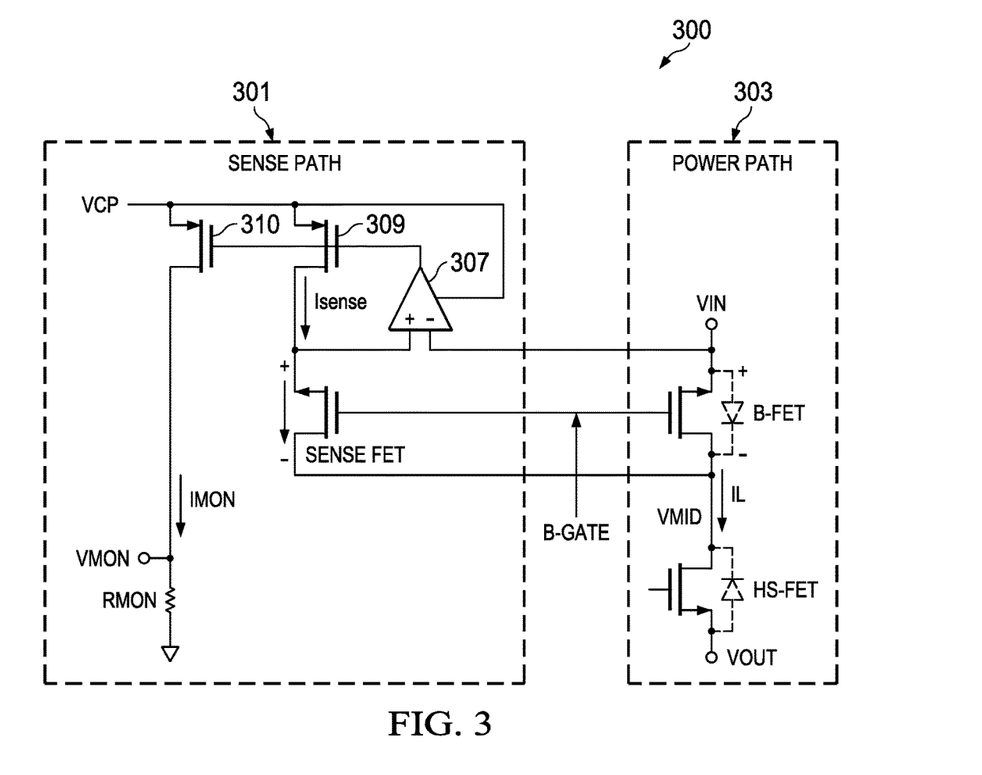
FIG. 3 is another circuit diagram of an alternative conventional power transistor circuit with a current monitor.

FIG. 3 is a diagram of another conventional power circuit 300. Similarly labeled components in FIG. 3 perform similar functions to the elements of power circuit 200 (in FIG. 2). For example, transistor HS-FET in FIG. 3 performs the same function as transistor HS-FET of FIG. 2. Power circuit 300 differs from power circuit 200 (see FIG. 2) in that the sense transistor SENSE FET, the blocking transistor B-FET and the high side transistor HS-FET have a common drain connection at the node VMID. Because of the common drain connections, these transistors can be implemented in a drain-down vertical FET device.

The circuit 300 includes a sense path 301 and a power path 303. In the sense path 303, an op-amp 307 is in a virtual ground comparator configuration. The source voltage of the SENSE FET is at the positive input terminal to the operational amplifier 307, and the source voltage of the blocking transistor B-FET, which is coupled to the input supply voltage VIN, is at the negative input terminal. The gate voltage for both the SENSE FET and the B-FET is coupled to the control voltage BGATE. Thus the SENSE FET and the B-FET are matched and the current ISENSE flowing through the SENSE FET in the SENSE PATH will be proportional to the load current IL flowing through the blocking transistor B-FET.

In operation, the current sensing occurs as the output of the op-amp 307 controls the gate of a feedback FET 309, which regulates the current ISENSE to match the load current IL. A mirror transistor 310 outputs the sense current as a monitor current IMON, and an output voltage is available at the output terminal VMON that is proportional to the current IMON. The voltage VMON can be controlled by selecting the value of the resistor RMON. A user can set a limit voltage and limit the current using a current limiting circuit (not shown in FIG. 3.) The gate signal to the high side transistor HS-FET can be controlled by the current limiting circuit and thus provide a current limiting function.

The conventional circuit 300 in FIG. 3 requires a charge pump (not shown for clarity) to provide the voltage VCP. Because the operational amplifier 307 has an input coupled to the input voltage VIN, the supply to the operational amplifier 307 needs to be a voltage higher than VIN. A charge pump is needed to supply this higher voltage, which is also used to provide the currents flowing in the sense path, ISENSE and the monitor current, IMON. Using a charge pump to provide voltage VCP and the currents ISENSE and IMON is undesirable. Charge pumps require significant power and silicon area, are relatively inefficient, and are expensive to manufacture.

Figure 4:
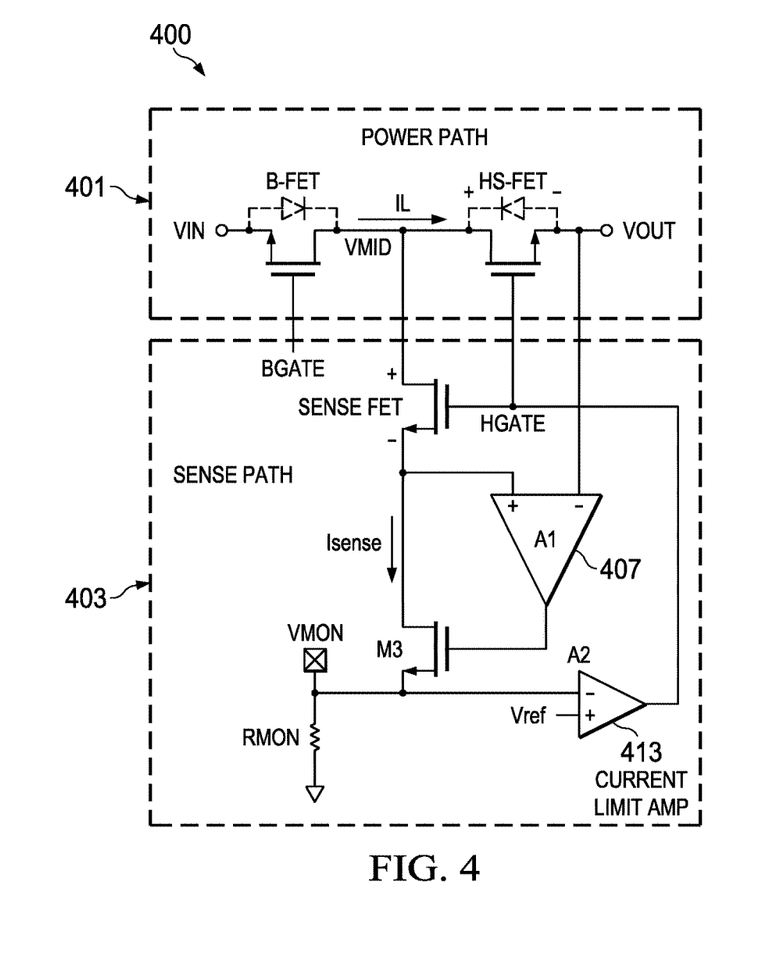
FIG. 4 is a circuit diagram for a conventional high side current sensing circuit.

FIG. 4 is a circuit diagram for a power circuit 400 including current sensing and current limiting. Similarly, labeled components in FIG. 4 perform similar functions as the elements of power circuit 300 (FIG. 3). For example, the high side transistor HS-FET in FIG. 4 operates in a similar manner to the high side transistor HS-FET in FIG. 3.

In FIG. 4, the POWER PATH 401 includes a high side transistor HS-FET for coupling an input voltage at input terminal VIN to output terminal VOUT where a load (not shown) receives the load current IL. In FIG. 4, the power path includes a blocking transistor B-FET controlled by a gate control voltage B-GATE. The intrinsic body diode of the B-FET transistor (not shown for simplicity of illustration) prevent currents from flowing from the output terminal VOUT to the input terminal VIN when the voltage at the output terminal exceeds the voltage at the input terminal VIN.

In FIG. 4, SENSE PATH 403 includes sensing circuitry. In this conventional circuit, current sensing is done by the transistor SENSE FET, which is coupled to match the high side transistor HS-FET. The high side transistor HS-FET is controlled by a current limit amplifier A2, labeled 413, that provides the gate control signal HGATE to both the HS-FET and the sense transistor SENSE-FET.

The current sensing circuitry includes op-amp 407 coupled with a virtual ground circuit at the input terminals. The source terminal of the sensing transistor SENSE-FET couples to the positive input terminal, while the source terminal of the high side transistor HS-FET is coupled to the negative input terminal. The op-amp 407 is in a feedback configuration with transistor M3 as the feedback transistor.

In operation, the sensing circuitry 403 senses the load current IL by matching the drain-to-source voltages for the high side transistor HS-FET and the sensing transistor SENSE-FET. Operational amplifier 407 is used to control the current through the feedback transistor M3. The current ISENSE will proportionally match to the load current IL.

In FIG. 4, the circuit 400 uses a blocking transistor B-FET, high side transistor HS-FET and a current sensing transistor SENSE-FET with a common drain connection at the node VMID. Because the drain terminals are coupled, these three FET devices can be implemented in a vertical FET device with the drains coupled together at the substrate in a drain-down configuration, such as in a NexFET™ device.

However, in the configuration of FIG. 4, the accuracy of the current Isense output by the SENSE FET transistor is limited. The sensing transistor SENSE FET has a gate terminal coupled to the gate connection HGATE for the HS-FET. In a current limiting situation, the voltage across the user specified resistor RMON is compared to a reference voltage Vref. If the current through the resistor RMON is above a current limit, the voltage VMON will exceed the reference voltage Vref and the current limit amp 413 will limit the current through the HS-FET by reducing the gate voltage HGATE. As HGATE is reduced, the gate voltage at the sense transistor SENSE FET is reduced and will lower the gate-to-source voltage (Vgs) of the sensing transistor. At low gate-to-source voltages, the threshold matching of the sense transistor SENSE FET to the high side transistor HS-FET is poor, and accuracy of the sensed current is therefore poor. The conventional circuit in FIG. 4 suffers from a lack of accuracy, especially in current limiting situations, when accuracy of the sensed current is most important.

Figure 5:
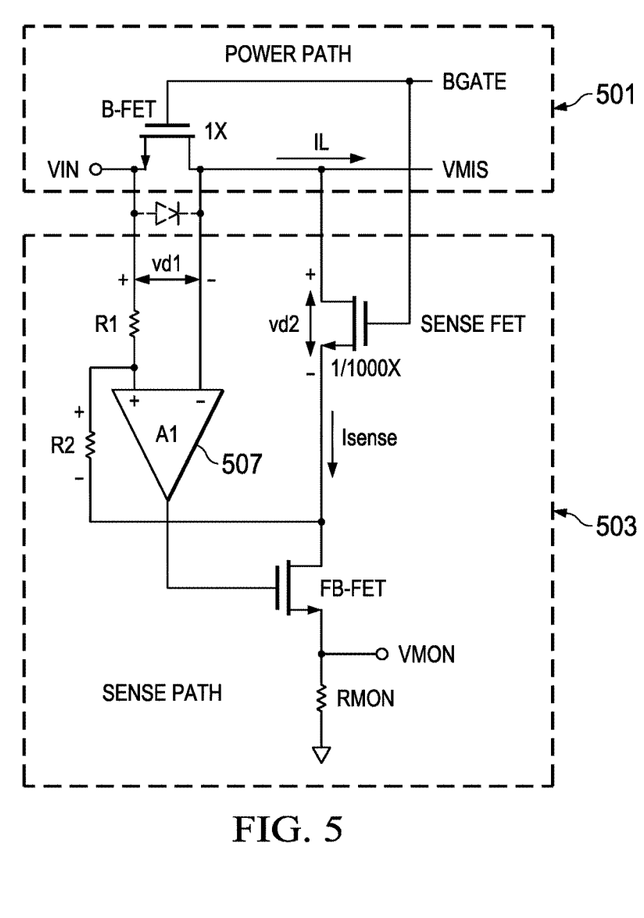
FIG. 5 is a circuit diagram for an embodiment for use in an e-fuse circuit including a current monitor.

FIG. 5 is a circuit diagram for an embodiment current sensing circuit useful for a high side power application. Similarly labeled components perform similar functions as the elements of power circuit 400 (FIG. 4). For example, the blocking transistor B-FET in FIG. 5 operates in a manner similar to the B-FET device in FIG. 4. In FIG. 5, sense path 503 is shown, while a portion of the corresponding power path 501 is shown. The complete power path is not shown in FIG. 5 but is further described hereinbelow. The features of the embodiments are applicable to arrangements formed with NexFET™ devices as well as other FET devices; and the embodiments are not limited to any particular type of FET device.

In FIG. 5 the circuit includes a blocking transistor B-FET with a current conduction path between a first current conduction terminal and a second current conduction terminal that are series coupled between the input terminal for receiving a supply voltage, VIN, and the common node, VMID. In FIG. 5, the first current conduction terminal is the source terminal of transistor B-FET, while the second current conduction terminal is the drain terminal of transistor B-FET. The blocking transistor has a gate control terminal coupled to the signal BGATE. The sense transistor SENSE-FET has a current conduction path between a first current conduction terminal coupled to the common node VMID and a second current conduction terminal coupled to provide a sense current output Isense. The gate of the sense transistor SENSE-FET is coupled to the gate control signal BGATE.

In FIG. 5, the current sensing is across the blocking transistor B-FET. Sensing transistor SENSE-FET is matched with the blocking transistor B-FET. Operational amplifier 507 is configured as a unity gain amplifier with a gain of "−1." The drain-to-source voltage of the blocking transistor B-FET, labeled "vd1" in FIG. 5, is added to the drain-to-source voltage for the SENSE-FET, labeled "vd2." The operational amplifier 507 will adjust the gate voltage for the feedback transistor FB-FET until the equality vd2=vd1*(R2/R1) is satisfied. The unity gain described for the operational amplifier 507 assumes the resistors R1 and R2 have the same value; however, in alternative embodiments changing the ratio of resistor R1 to resistor R2 can provide additional adjustment to the gain for the op-amp 507, as shown by the equality. By using a ratio of resistors R2 to R1 that is less than 1, additional scaling can be achieved, allowing for smaller sense currents, and a corresponding reduction in power consumption.

In operation, the current flowing through the sensing transistor SENSE-FET is proportional to the load current IL (scaled by the device size ratio, for example by a 1/1000 scaling factor). The sense current is more accurate due to the use of the operational amplifier 507 and the feedback transistor FB-FET. The operational amplifier adjusts the gate voltage of the feedback transistor FB-FET in response to any voltage difference between the drain-to-source voltage vd1, for the blocking transistor B-FET which carries the load current IL, and the drain-to-source voltage vd2 for the sense transistor SENSE-FET, which carries the sense current through its current conduction path. The voltage at the terminal VMON provides a voltage due to the sense current that is therefore proportional to the load current IL. The value of the resistor RMON can be adjusted to change the voltage VMON for a given monitor current IMON, and the voltage VMON can be used to set a limit current for use by a current limiting circuit (not shown).

The embodiment of FIG. 5 provides a common drain node VMID for the blocking transistor B-FET and the sensing transistor SENSE-FET. This common connection can be further extended to include the drain of a high side FET (not shown in FIG. 5, but describer further hereinbelow). Because the drain terminals are connected at a common node, these three FETs can be implemented on a vertical FET device, such as a NexFET™ device. The accuracy of the sensed current Isense for the embodiment of FIG. 5 is high, because the blocking transistor B-FET is used to sense the load current. The blocking transistor B-FET has a gate voltage B-GATE that is independent from the gate voltage to a high side transistor (not shown). When a current limit situation occurs, the gate voltage B-GATE does not change, so that the sensing transistor and the blocking transistor B-FET and SENSE FET have a high gate voltage, even when the high side gate voltage is being controlled to limit the load current. Because the gate-to-source voltages for both the B-FET and the sensing transistor SENSE-FET remains high during a current limiting event, the sensed current remains accurate as the sensing transistor and the blocking transistor are well matched and both are kept in the linear region of operation by the voltage BGATE at the gate terminals. Note that while the embodiment of FIG. 5 can be used with a common drain node in a vertical FET device, the embodiment can also be used with non-vertical FET devices, such as lateral FET devices, and provides accurate current sensing in part due to the use of the operational amplifier and the feedback transistor.

Figure 6:
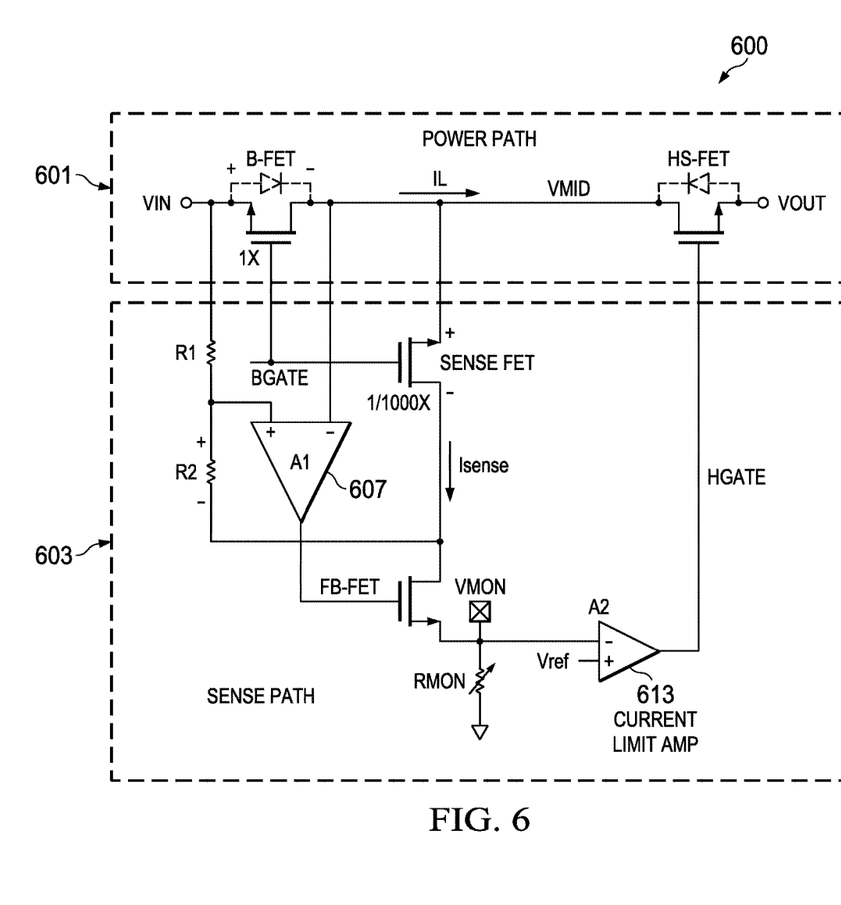
FIG. 6 is a circuit diagram of an embodiment incorporating the current monitor embodiment of FIG. 5.

FIG. 6 is a circuit diagram for an embodiment power circuit 600 showing the use of the current sensing arrangement in FIG. 5 to provide a current limiting function within a power supply circuit. Similarly labeled components in FIG. 6 perform similar functions as the corresponding elements of circuit 503 (FIG. 5). For example, the blocking transistor B-FET in FIG. 6 operates in a similar manner to the blocking transistor B-FET in FIG. 5.

In FIG. 6, POWER PATH 601 includes a high side transistor HS-FET and the blocking transistor B-FET that are coupled to supply current and voltage from an input voltage supply coupled at a terminal VIN to the output terminal VOUT. The load current IL will flow into a load coupled to the output terminal VOUT (not shown). The POWER PATH 601 is coupled to the SENSE PATH 603 that includes components arranged in a manner similar to the embodiment of FIG. 5, and further includes a current limit amplifier 613. The operational amplifier 607 is coupled in a unitary gain configuration with a gain of -1 when the resistors R1 and R2 have the same value, as described hereinabove with respect to FIG. 5. This gain can be modified by changing the ratio of R2/R1, providing additional adjustment. In FIG. 6, the resistor RMON is shown implemented using an adjustable value resistor. By adjusting the value of the resistor RMON, the voltage that appears at the terminal VMON can be adjusted. By setting the monitor voltage VMON to a voltage greater than the reference voltage Vref for a selected limit current, a current limiting function can be implemented. In an alternative embodiment, the reference voltage Vref can be also be adjusted to adjust the limit.

In operation, when the high side transistor H-FET is delivering a current IL into a load (not shown) coupled to the output terminal VOUT, the current Isense will be proportional to the load current IL. The proportion is determined by the device area (W/L) ratio between the blocking transistor B-FET and the sensing transistor SENSE-FET. In an example, the scale is 1000, so that the current Isense is $\frac{1}{1000}$th of the load current IL. In additional embodiments, other scaling factors can be used. The ratio of resistor R1 to R2 provides additional scaling. A 5 to 1 ratio can be used, or other ratios different from 1 to 1 can be used.

When the voltage at the voltage monitor terminal VMON exceeds the reference voltage Vref, the current limiting amplifier 613 will limit the current flowing into the load at the output terminal VOUT. The control is done by modifying the gate voltage control signal HGATE. Because the gate control signal HGATE of the high side transistor is controlled, while the gate control signal BGATE remains the same during current limit events, the accuracy of the sensed current Isense is not impacted when the HGATE voltage changes, and even when the gate-to-source voltage HGATE of the high side transistor approaches the threshold voltage Vt.

In an example implementation, the blocking transistor B-FET, the high side transistor HS-FET and the sense transistor SENSE-FET are formed on a vertical FET semiconductor device with a "drain down" configuration, so that the node VMID is coupled to the semiconductor substrate. The operational amplifier 607 and the current limiting amplifier 613 can be implemented on a separate conventional CMOS semiconductor device. The resistors R1 and R2 can be formed on the CMOS device, or alternatively, can be provided using external resistors. The adjustable resistor RMON can be provided by a designer for a particular application and can have fixed, adjustable, or programmable values. The reference voltage Vref can also be a fixed, or an adjustable value, alternatively the value can be selected from pre-programmed voltage levels.

Figure 7:
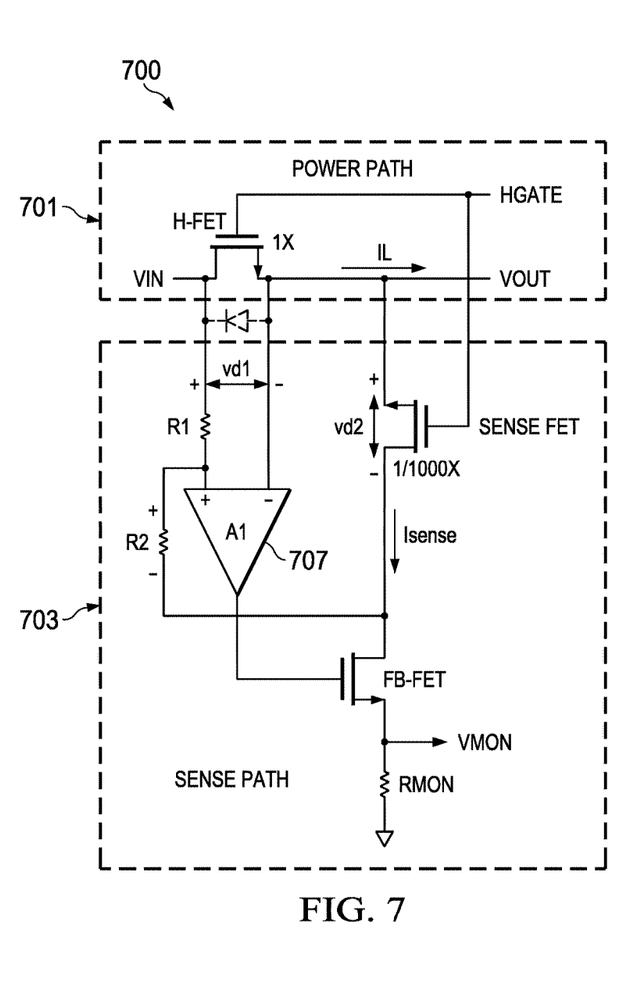
FIG. 7 is a circuit diagram of a high side transistor embodiment with a current monitoring circuit.

FIG. 7 is a circuit diagram for another embodiment circuit 700 arranged for an application without current blocking. In FIG. 7, no blocking transistor is provided. In an application current may be allowed to flow form the output terminal VOUT back to the input terminal VIN in certain situations. The embodiment of FIG. 7 includes a high side transistor labeled H-FET with a current conduction path coupled between an input terminal VIN and an output terminal VOUT. In FIG. 7, the H-FET provides an embodiment that is compatible with a "source-down" vertical FET device such as a NexFET™ device. Other power FET devices can also be used. In FIG. 7, the high side transistor H-FET and the sense transistor SENSE-FET both have a first current conduction terminal, the respective source terminals, coupled together in a common source circuit, so that these FETs can be implemented in a "source down" vertical FET device with the source terminals at the substrate.

In FIG. 7, the power path 701 includes only a high side transistor H-FET coupled between the input terminal for a supply voltage, VIN, and the output terminal for coupling a load to the circuit, VOUT. A load current IL flows through the transistor H-FET and to the output terminal VOUT.

A control signal HGATE controls the gate voltage for the transistor H-FET. The SENSE PATH 703 includes a unitary gain configured op-amp 707, resistors R1 and R2, and a feedback transistor FB-FET coupled with the gate terminal coupled to the output of the op-amp 707. A closed loop exists with the op-amp 707 having the drain-to-source voltage for the H-FET transistor, labeled "vd1" across the positive and negative terminals. The amplifier reflects this voltage to the node receiving the drain-to-source voltage "vd2" of the sensing transistor SENSE-FET. The op-amp 707 will adjust the gate voltage to the feedback transistor FB-FET to make the equality vd2=vd1*R2/R1 true. When the SENSE-FET has the same drain-to-source voltage as the H-FET, the sense current Isense will be proportional to the load current IL. The proportion is, as for the embodiments described hereinabove, determined by the device area ratios of the H-FET device and the sense transistor SENSE-FET. In an example, the proportion is $\frac{1}{1000}$, so that the sense current Isense is scaled to $\frac{1}{1000}^{th}$ of the load current IL.

In operation, the value of the monitor resistor RMON, which is external to the integrated circuits, sets the voltage VMON. A current limiting circuit that controls the gate voltage HGATE (not shown in FIG. 7) can then be used with VMON and a reference voltage to control the load current.

An advantage of the circuit arrangement of the embodiment of FIG. 7 is that the sense transistor and the high side transistor H-FET can be implemented in a vertical FET technology using a common source node at the substrate, e.g., a "source-down" device. However, because the gate voltage of the sense transistor SENSE-FET is at the same node as the gate voltage of the high side transistor H-FET, the accuracy of the sensed current in low gate voltage conditions is reduced when compared to the other embodiments. As the current limit is reached and the voltage HGATE is reduced to limit the load current IL, the two devices SENSE-FET and H-FET will no longer be closely matched, and the sense current will not accurately track the load current IL.

The embodiments provide a current monitor output that can be used to provide a current limiting function for a FET delivering current to a load. In a case where the load current suddenly increases, the circuits described hereinabove may not be fast enough to shut down the power transistor current conduction paths to prevent damage. This can happen if the output is suddenly shorted to ground, or a short circuit occurs in a load device.

Figure 8:
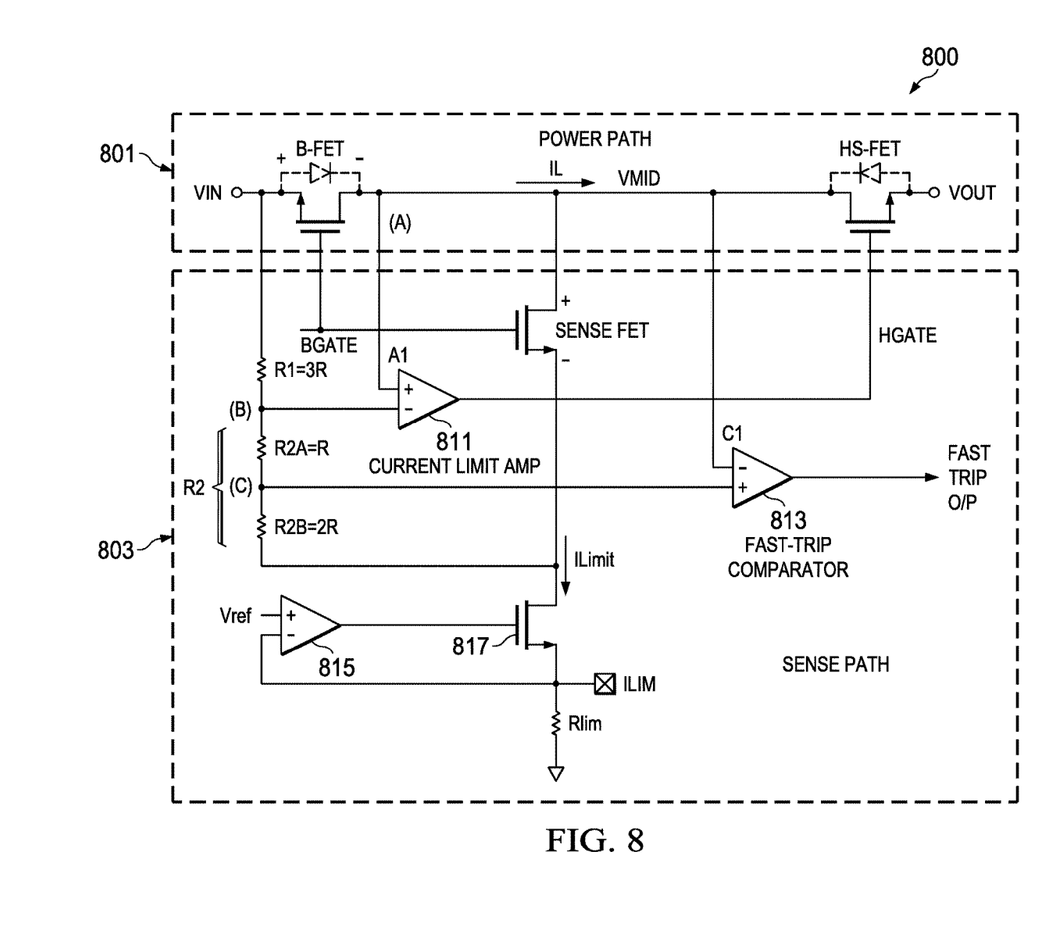
FIG. 8 is a circuit diagram of an embodiment circuit having a fast trip comparator and a current limit.

FIG. 8 is a circuit diagram for an alternative embodiment 800 with a fast trip comparator and having a fast trip output signal that can be used to quickly shut down the power path of the circuit. The fast trip output signal can also be used to limit the load current to a safe level. The fast trip comparator circuit triggers when the load current exceeds a multiple of the value of a current limit. It is usually desirable to have a short circuit threshold (the multiple used to trigger the fast trip comparator) that scales with the current limit. An an example, a short circuit current threshold can be set to be 2 times the current limit. In an example embodiment, if the current limit increases the short circuit current will increase in scale with the current limit increase.

In FIG. 8, POWER PATH 801 includes a blocking transistor BFET and a high side transistor HS-FET coupled with the current conduction paths in series between a terminal for an input voltage VIN and an output terminal for outputting an output voltage VOUT. A load (not shown) can receive a load current IL that flows through the transistors B-FET and HS-FET. In the SENSE PATH 803, sensing transistor SENSE FET is coupled to match the blocking transistor B-FET and has a drain terminal at the common drain node VMID, and has a gate terminal that is coupled along with the gate of blocking transistor B-FET to the gate control signal BGATE.

A current limiting amplifier 811 is coupled to node (B) that is also coupled to the source terminal of the blocking transistor B-FET through the resistor R1 with a value 3R, and is also coupled to the common drain node VMID and to the drain of the blocking transistor B-FET at the node (A). Thus, the two inputs to the differential amplifier 811 are coupled to receive the drain-to-source voltage of the blocking transistor B-FET. The sensing transistor SENSE-FET is coupled to output a current ILimit. Because the source terminal and the gate terminal of the sense transistor are coupled in common with the source terminal and the gate terminal of the blocking transistor B-FET, the sense current ILimit will be proportional to the load current IL, as described hereinabove. The output of the current limit amplifier 811 controls the gate terminal of the high side transistor HS-FET.

Instead of providing a monitor output VMON, the embodiment of FIG. 8 is arranged to limit the load current IL to a specific limit current ILimit that is set by the operational amplifier 815, the reference voltage Vref, the transistor 817, and the limit resistor Rlim. This circuit works as a voltage-to-current convertor and it sets the limit current ILimit to be equal to the current level Vref/Rlim. When the load current rises to the limit current ILimit, the control loop formed by current limiting amplifier 811 via the high side transistor HS-FET becomes active, and starts reducing the voltage at the gate of the high side FET using the control signal HGATE, thus controlling the load current IL and preventing it from rising further.

In operation, the current limiting amplifier 811 will control the current IL to match the current ILimit by changing the gate signal HGATE of the HS-FET when the current limit is met. In addition, the embodiment of FIG. 8 provides a fast trip function. The fast trip comparator amplifier 813 compares the voltage at common node (A), which is the drain terminal for the transistors, to the voltage at node (C). Node (C) is a voltage created using a resistor divider. In FIG. 8, the resistor R1 has a value of 3R, while resistor R2 is implemented using a series resistance of R2A (=R)+R2B (=2R). As shown in FIG. 8, the resistors R1 and R2 can be equal. The use of the two resistances R2A and R2B in a ladder to form resistor R2 creates a voltage at node (C) for use by the fast trip comparator amplifier 813.

Figure 9:
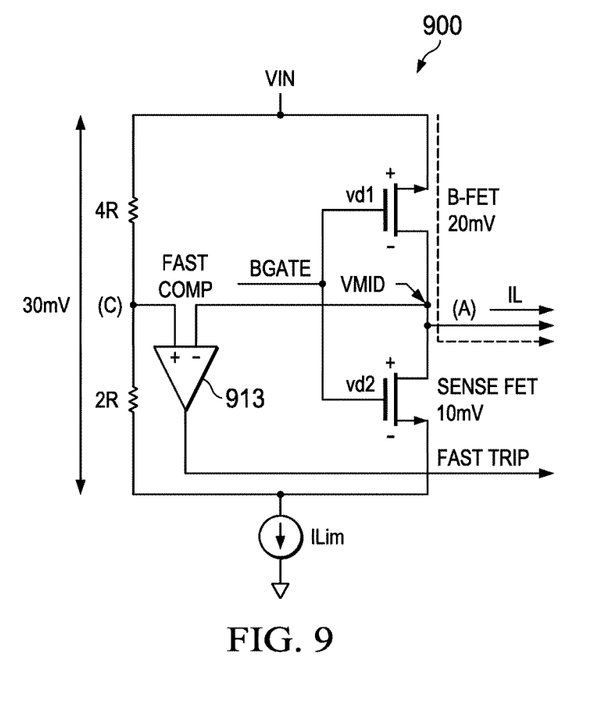
FIG. 9 is a circuit diagram illustrating the operation of a portion of a fast trip comparator for use with the embodiments.

FIG. 9 illustrates a simplified circuit schematic used to further explain the operation for the fast trip comparator circuit for use in an embodiment. In FIG. 9, similar reference labels are used for components similar to those in FIG. 8. For example, in FIG. 9, comparator 913 corresponds to comparator 813 in FIG. 8.

In FIG. 9, the resistor ladder including resistors of value 4R (the series resistance of R1 (=3R), and resistor R2A (=R), the blocking transistor B-FET, and the sensing transistor SENSE-FET form a Wheatstone bridge. Comparator 913 is triggered when the voltage at node (C) exceeds the voltage at node (A). Normally, the load current IL will be such that the voltage at node (A) will exceed the voltage at node (C). In an event where the load current IL suddenly rapidly increases, the voltage at node (A) will quickly drop (when compared to the voltage at node (C)). The comparator 913 will respond with a signal at the output signal FAST TRIP O/P. In FIG. 9, an example voltage drop across the resistor ladder is shown as 30 millivolts, and the corresponding voltage drop across the blocking transistor B-FET is 20 millivolts, while the sensing transistor sees a drop of 10 millivolts. The load current IL flows through the blocking transistor B-FET, but not through the sensing transistor SENSE-FET. When the load current IL suddenly increases, the fast comparator 913 will trigger as the drain-to-source voltage across the blocking transistor B-FET suddenly increases, lowering the voltage at node (A), while at the same time the voltage at node (C) is not affected by the increased load current IL.

This particular fast trip circuit example achieves a short circuit current threshold (i.e., the current at which the FAST TRIP output signal becomes active) at 2 times that of the current limit ILimit. For example, if the current limit is 1 Ampere, the fast trip signal FAST TRIP will be triggered when the current IL suddenly exceeds 2 Amperes. This can happen when a sudden short occurs at the circuit output VOUT in FIG. 8, when the load current IL may rise faster than the response time of the current limit loop including amplifier 811. By changing the resistor arrangement and values, different current limit thresholds can be selected.

Figure 10:
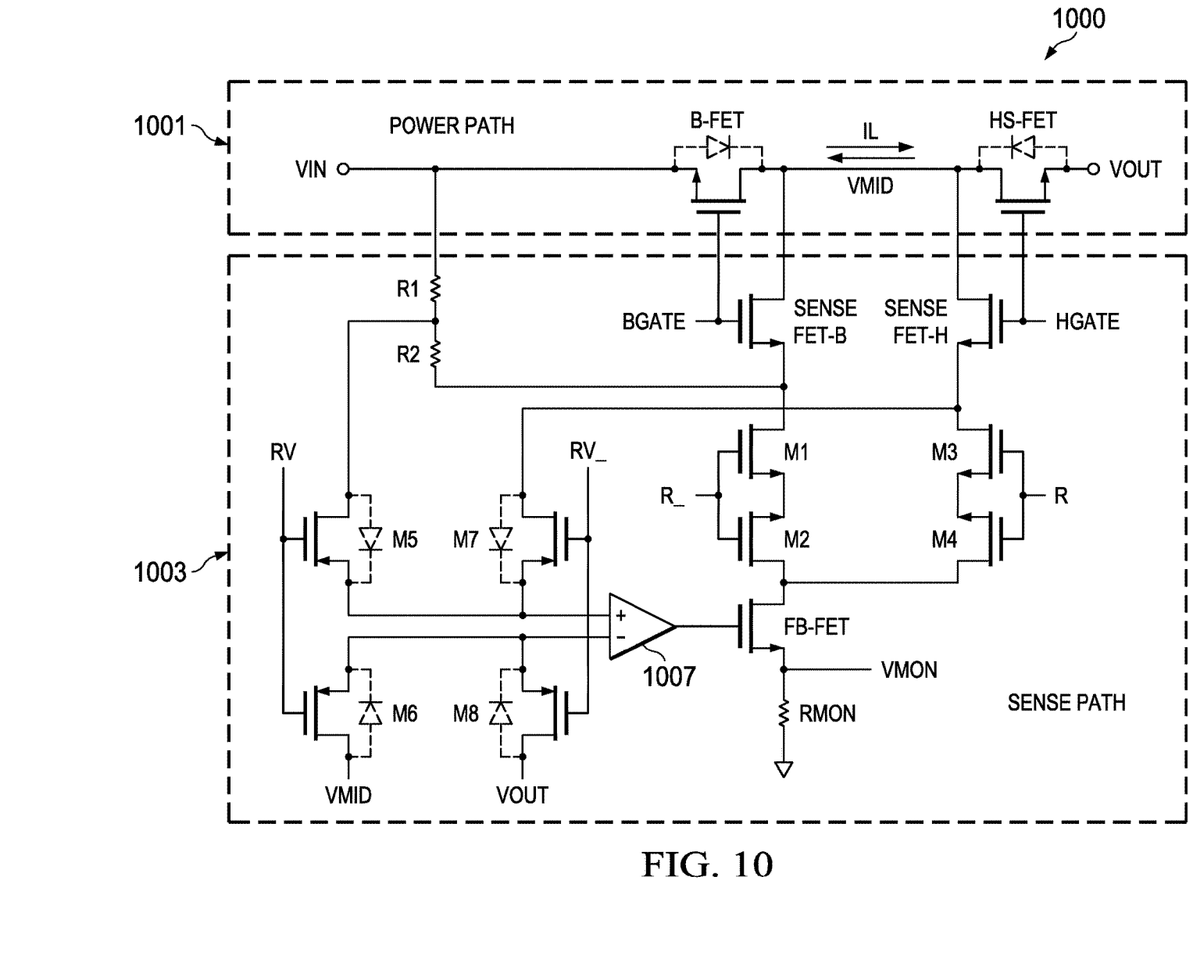
FIG. 10 is a circuit diagram of an embodiment for a bi-directional current path in a power transistor circuit having a current monitor for load current flowing in two directions.

FIG. 10 is a circuit diagram for an additional alternative embodiment circuit 1000. In FIG. 10, the reference labels are similar to the reference labels in FIG. 8 for similar components. For example, the amplifier 1007 in FIG. 10 is similar to the amplifier 815 in FIG. 8. In FIG. 10, the load current can flow in either direction, from the terminal VIN for receiving a supply voltage to the output terminal VOUT, or alternatively the load current can flow in the opposite direction. In certain applications, the VIN and VOUT terminals can couple two devices that can either receive current or supply it. For example, a USB-C connector interface can be between two battery-powered devices and current can flow in either direction. In the embodiment of FIG. 10, the circuitry is arranged to share the amplifier 1007. Amplifier 1007 can be a differential amplifier and can be implemented as an operational amplifier. By sharing this part of the circuit, silicon area and expense are reduced. However, as described hereinbelow, additional transistors are used to couple the voltages needed to the amplifier 1007, depending on the direction of current flow. In an alternative embodiment, an additional amplifier can be used, although at the expense of added silicon area.

In FIG. 10, the blocking transistor B-FET and the high side transistor HS-FET are coupled with current conducting paths between the input terminal VIN and the output terminal VOUT. The load current IL will flow through both the blocking transistor B-FET and the high side transistor HS-FET when the power path 1001 is active. There are two current sensing transistors in system 1000, the sensing transistor SENSE-FET B and the sensing transistor SENSE-FET H. Each sensing transistor has a common node with the power transistors at node VMID. The embodiment of FIG. 10 is compatible with a "drain down" configuration, so that the drain terminals of the blocking transistor B-FET, the blocking sense transistor SENSE-FET B, the high side transistor HS-FET and the high side current sensing transistor SENSE-FET H are coupled to the node VMID. The devices in POWER PATH 1001 can therefore be implemented using a semiconductor device with a vertical FET arrangement, such as a NexFET™ device. However, other power FET transistors can also be used with the current sensing circuitry of the embodiments, whether vertical FETs, or otherwise. Discrete FET devices can be used.

When the input voltage at terminal VIN is greater than the output voltage at terminal VOUT, the embodiment in FIG. 10 operates in a similar manner to the embodiment in FIG. 8. The sensing circuit in SENSE PATH 1003 couples one terminal of the amplifier 1007 to the source terminal of the blocking transistor B-FET, which is coupled to terminal VIN, using the resistor network R1, R2 and the transistor M5. The signal RV is at a "low" potential in this example, as the circuit is operating in a forward fashion with current IL flowing from VIN to VOUT. The opposite terminal of the amplifier 1007 is coupled to the common drain node VMID by transistor M6, which is also controlled by the signal RV. Note that in the example embodiment of FIG. 10, the transistors M5, M6, M7, and M8 are P-channel transistors, and are active when a "low" potential is on the gate terminals. These transistors form a select circuit that selects between the node between R1 and R2 as an input to the positive terminal of the operation amplifier, 1007; and the output of the high side sense FET SENSE FET-H, depending on the direction of the current as indicated by control signals RV, RV_. The selection circuit selects between the voltage VMID and the output voltage terminal VOUT for the input to the negative input terminal of operational amplifier 1007. The operational amplifier 1007 will control the current flowing in the feedback transistor FB-FET to keep the current flowing through the monitor resistor RMON proportional to the load current IL. In an example embodiment, the amplifier 1007 is an operational amplifier coupled in a closed loop configuration.

In the embodiment of FIG. 10, system 1000 can also sense current when the load current IL reverses direction and flows from the output terminal VOUT towards the input terminal VIN. In this configuration, the current IL flows through the high side transistor HS-FET and the blocking transistor B-FET towards the terminal VIN. This situation occurs while the voltage at terminal VOUT is greater than the voltage at terminal VIN. The sensing transistor SENSE-FET H is coupled with its gate in common with the voltage at the gate of the high side transistor (signal HGATE is coupled to both gate terminals) and the drain of both devices is coupled to the common drain node VMID. Accordingly, the sensing transistor SENSE FET-H is matched with the high side transistor HS-FET. The sensed current flowing through the high side sensing transistor SENSE FET-H will be proportional to the load current flowing through the high side transistor HS-FET. Another selection circuit is formed of transistors M1, M2 and M3, M5, and selects between the SENSE FET-B output and the SENSE FET-H output, depending on control signals R_ and R. When the current is reversed as indicated by signal R, transistors M3, M4 will couple the high side sense current to the feedback transistor FB-FET, and the sensed current can be observed as a voltage at the monitor terminal VMON. The operational amplifier 1007 will be coupled to the source of the high side transistor (coupled to terminal VOUT) by transistor M8, while the drain terminal of the high side transistor is coupled to the opposite terminal of the amplifier 1007 by the transistor M7. Both transistors M7 and M8 have the direction signal RV coupled to the gate terminals. Transistor M3 and M4 have direction signal R coupled to the gate terminals.

The signals RV and RV_ are direction signals that indicate when the current IL is flowing in the reverse direction, level shifted to the voltage of the VMID domain. The signals R and R_ are the direction signals that indicate when VOUT is greater than VIN and the load current IL flows in the reverse direction. The signals RV and RV are coupled to a first selection circuit that selects the signals to the positive and negative input terminals of the operational amplifier 1007. The signals R and R_ are coupled to the second selection circuit that selects the sense current that is input to the feedback transistor FB-FET.

In operation, the sensed current flowing through the feedback transistor FB-FET is proportional to the load current as described hereinabove; the proportion is determined by the device area ratio between the sense transistors SENSE FET_B, SENSE FET-H, and the power transistors B-FET and HS-FET. In an example the sense transistors are $\frac{1}{1000}^{th}$ the device size of the power transistors, and the sense current is therefore $\frac{1}{1000}^{th}$ the magnitude of the load current IL.

By detecting the direction of the load current and by enabling the appropriate sense current path and sensing devices, the embodiment of FIG. 10 can provide a sense current for two conditions, where VIN>VOUT and the load current flows from VIN towards VOUT, and where VOUT>VIN, and the load current flows in the reverse direction from VOUT towards VIN.

Figure 11A:
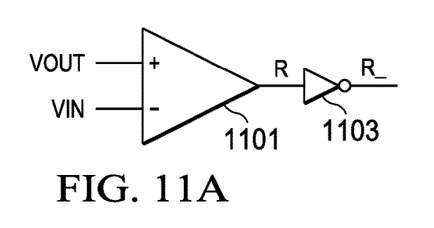
FIGS. 11A and 11B are circuit diagrams for circuitry for use with the embodiment of FIG. 10.
Figure 11B:
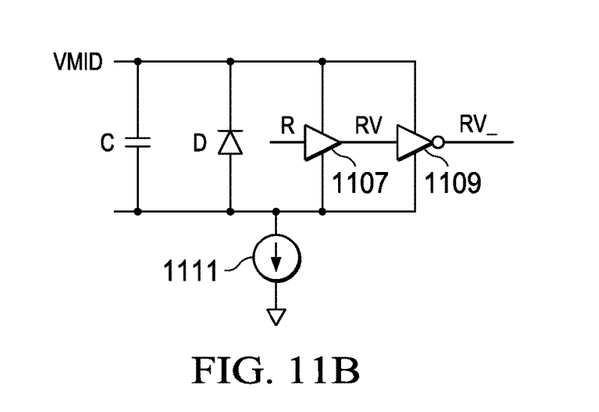

In FIG. 10, the signals R and R_ and the corresponding level shifted signals RV and RV_ are needed for the operation of the circuit 1000. FIG. 11A is a circuit diagram for one arrangement for providing the direction signals R and R_. FIG. 11B is a circuit diagram for a level shifting circuit that produces signals RV and RV_.

In FIG. 11A, a voltage comparator 1101 compares the voltage at the input terminal VIN with the voltage at the output terminal VOUT and determines when VOUT is at a higher voltage than VON. When the output voltage VOUT is the greater voltage, a signal R goes active, indicating the current is reversed. Signal R_, the inverse signal, is then simply output by the inverter 1103. FIG. 11B is a circuit for a level shifter than shifts the signal R to the VMID voltage using buffers that are supplied by the voltage VMID. Buffer 1107 outputs a level shifted version of the signal R, RV. The inverter 1109, which also receives the voltage VMID, outputs the inverted signal RV_. A current bias 1111 provides current to the level shift circuit. Other arrangements can be made for a level shifting circuit for use with the embodiments.

Figure 12:
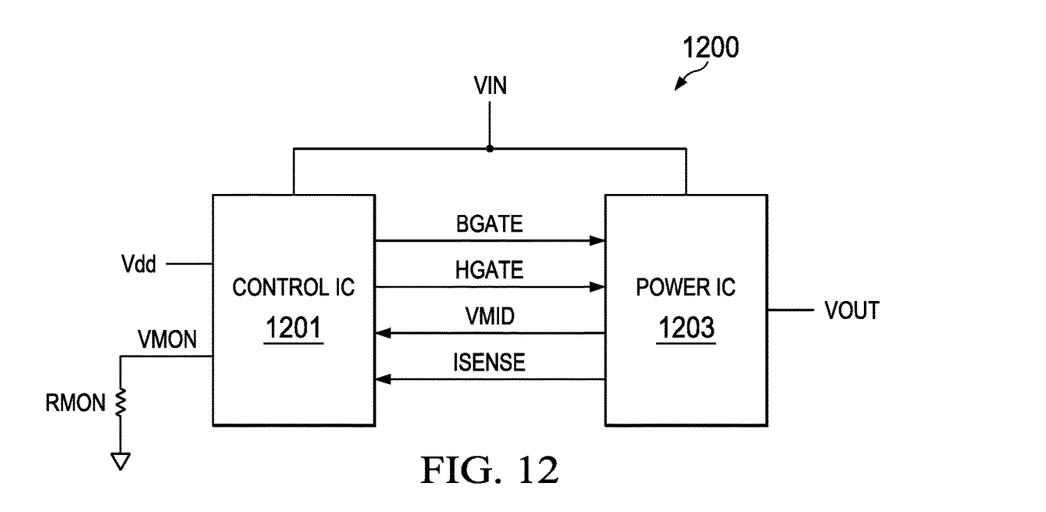
FIG. 12 is a system block diagram for an embodiment e-fuse system including a power transistor integrated circuit coupled to a controller integrated circuit.

FIG. 12 is a block diagram for an embodiment E-fuse system. In FIG. 12, a first integrated circuit 1203 includes the power transistors and a sense transistor in a single device. In the embodiment of FIG. 12, the power path for an E-fuse system including a blocking transistor, a high side transistor, and a sense transistor, can be implemented on a single semiconductor substrate using a power transistor technology. In an example, a vertical FET device can be used. In one example, a NexFET™ device from Texas Instruments Incorporated can be used. However, the current sensing and current limiting embodiments described hereinabove can also be used with other power FET technologies. Discrete FET devices on a circuit board can be used to form the embodiments.

In FIG. 12, a control IC 1201 can include the operational amplifier, resistor divider circuitry, and a feedback FET device, the sense path devices as described hereinabove. Because the sensed current can be scaled to be much less than the load current, and because the circuitry in the control IC 1201 including the operational amplifier can be powered by a typical low current IC supply voltage, a conventional high voltage, low current CMOS semiconductor device can be used for implementing the control integrated circuit 1201. Using the low current device results in lower system costs and reduced power consumption.

In operation, the control IC 1201 can supply the BGATE and HGATE signals to cause the power IC 1203 to supply a current to a load (not shown) coupled to the output terminal.

The power IC 1203 can have the current conduction paths of the power transistors coupled in series between the output terminal and the input voltage at the input terminal VIN. The load current can be sensed by the sense transistor on the power IC, and the sensed current is output on the ISENSE signal. The operational amplifier and the feedback transistor in the control IC can be used to provide the output voltage VMON using an external resistor RMON. In an example embodiment, a current limiting circuit can also be provided within the control IC 1201. When a load current that is in excess of a limit occurs, the gate voltage HGATE can be reduced to control the load current. This can be performed when the voltage VMON exceeds a reference voltage, as described hereinabove.

In the embodiments, the power transistor or transistors and a sense transistor can share a common drain node or a common source node. An advanced FET semiconductor device such as a vertical FET can be used to implement the power transistors and the sense transistor on a single substrate with a shared drain or shared source node formed at the substrate. In alternative embodiments, lateral FET devices used for power transistors can also be used with the current sensing and current limiting circuitry described hereinabove.

Alternative arrangements that can form additional embodiments include increasing the level of integration to form a single integrated circuit that includes the current sensing and the power circuitry. However, because the semiconductor processes for the power FETs are optimized for high voltage, high current capable transistors and are more expensive than conventional CMOS processes, it can be more cost effective to produce embodiments arranged as two integrated circuits as shown in FIG. 12.

In an example, an apparatus includes: a first power transistor having a first current conduction path between a first current conduction terminal and a second current conduction terminal, the first current conduction path of the first power transistor coupled between an input for receiving a supply voltage and a node, the first power transistor having a first gate terminal for controlling the first power transistor coupled to a first gate control signal; a second power transistor having a second current conduction path between a third current conduction terminal and a fourth current conduction terminal, the second current conduction path of the second power transistor coupled between the node and an output terminal for supplying a load current to a load; the second power transistor having a second gate terminal coupled to a second gate control signal; a current sense transistor having one current conduction terminal coupled to the node and the first power transistor, having a third gate terminal coupled to the first gate control signal, and outputting a sense current at another current conduction terminal; a differential amplifier having a first input coupled to one of the first and second current conduction terminals of the first power transistor and having a second input coupled to the other one of the first and second current conduction terminals, and having an output signal responsive to a voltage difference between the first input and the second input; a feedback transistor having another current conduction path coupled in series between the current sense transistor and a monitor node, having a feedback transistor gate terminal coupled to the output of the differential amplifier; and a resistor coupled between the monitor node and ground, the sense current flowing through the resistor, the sense current being proportional to the load current flowing through the second power transistor.

In a further example, in the above-described apparatus, the current sense transistor is formed on a semiconductor substrate with the first power transistor, and a device area of the current sense transistor is smaller than a device area of the first power transistor.

In another example, in the above-described apparatus, the sense current flowing through the current sense transistor is proportional to the load current. In an additional example, in the above-described apparatus, the first power transistor, the second power transistor and the current sense transistor are FET devices formed on a single integrated circuit. In a further example, the FET devices forming the power transistors are ones selected from vertical FET devices and non-vertical FET devices.

In yet another example, in the above-described apparatus, the node is formed in a semiconductor substrate of the single integrated circuit.

In an alternative arrangement, the above-described apparatus is provided and further includes a fast trip comparator coupled between the node and a voltage divider coupled to the input, for outputting a fast trip signal in response to a drop in a voltage at the node when the load current rapidly increases.

In still another example, the above-described apparatus further includes a current limit circuit coupled to the second gate terminal of the second power transistor for limiting the voltage of the second gate control signal when the sensed current exceeds a current limit.

In still another example, in the above-described apparatus, the first current conduction terminal of the first power transistor is a first source terminal, the second current conduction terminal of the first power transistor is a first drain terminal, the third current conduction terminal of the second power transistor is a second drain terminal, the fourth current conduction terminal of the second power transistor is a second source terminal, and the current sense transistor has a third drain terminal as the current conduction terminal that is coupled to the first drain terminal of the first power transistor and the second drain terminal of the second power transistor at the node.

In yet another example, in the above-described example, the differential amplifier is an operational amplifier. In still a further example, the operational amplifier is coupled in a closed loop with the feedback transistor.

In another example, circuitry includes: a first field effect transistor having a first source terminal and a first drain terminal, the first source terminal coupled to an input terminal for receiving a power supply and the first drain terminal coupled to a node; and having a first gate terminal for receiving a first gate control signal; a second field effect transistor having a second drain terminal and a second source terminal, the second drain terminal coupled to the node and the second source terminal coupled to an output terminal for supplying a load current to a load, and having a second gate terminal for receiving a second gate control signal; a current sensing transistor having a third drain terminal coupled to the node and a third source terminal coupled to output a sense current, the current sensing transistor having a third gate control terminal coupled to the first gate control signal; a first current limiting amplifier having a first input coupled to the input terminal and a second input coupled to the node, and outputting the second gate control signal; and an operational amplifier coupled with a feedback transistor, the operational amplifier having a voltage reference at a first input and a current limit output terminal at a second input, and having an output coupled to the gate terminal of the feedback transistor, the feedback transistor having a current conduction path coupled between the sense current output of the current sensing transistor and the current limit output terminal.

In yet another example, the above-described circuitry is provided and further includes a first resistor coupled between the input terminal and the first input of the current limiting amplifier, and a second resistor coupled between the first resistor and the third source terminal of the current sensing transistor.

In still another example, in the above described circuitry, the second resistor further includes a third resistor and fourth resistor in a resistor ladder configuration.

In yet another example, the above-described circuitry further includes a fast trip comparator circuit coupled to compare a voltage between the third resistor and the fourth resistor to the voltage at the node, to output a fast trip output signal responsive to the voltage at the node dropping indicating a rapid increase in the load current.

In still another additional example, the above-described circuitry further includes a current limit resistor coupled between the current limit output and ground. In an additional example, in the above-described example, the first field effect transistor, the second field effect transistor, and the current sensing transistor are on an integrated circuit.

In yet another example, an apparatus includes: a voltage input terminal for receiving a supply voltage; a voltage output terminal for coupling to a load; a first power transistor having a first current conduction path coupled between the voltage input terminal and a common node, and having a first gate terminal coupled to a first gate control signal; a second power transistor having a second current conduction path coupled between the common node and the voltage output terminal, and having a second gate terminal coupled to a second gate control signal. The apparatus further includes: a first current sense transistor having a third current conduction path coupled to the common node and having a third gate terminal coupled to the first gate control signal, for outputting a first sense current proportional to a load current flowing from the voltage input terminal to the voltage output terminal; a second current sense transistor having a fourth current conduction path coupled to the common node and having a fourth gate terminal coupled to the second gate control signal, and outputting a second sense current proportional to the load current flowing from the output terminal to the input terminal; a differential amplifier having a first input terminal and a second input terminal and having an output signal corresponding to a difference between voltages at the first input terminal and the second input terminal; and a feedback transistor coupled to a monitor resistor at a monitor node, and having a current conduction path coupled to one of the first sense current and the second sense current, and having a gate control terminal coupled to the output of the differential amplifier.

In still another example, the apparatus described-above further includes a first selection circuit for coupling the first input terminal of the differential amplifier to a selected one of: a resistor coupled to the input voltage terminal, and to the second current sense transistor, responsive to a signal indicating a load current direction.

In yet another example, the apparatus described above further includes: a second selection circuit for coupling the feedback transistor to one of the first sense current from the first current sensing transistor and to the second sense current from the second current sensing transistor, responsive to a signal indicating a load current direction.

Modifications are possible in the described embodiments, and other embodiments are possible within the scope of the claims.

What is claimed is:

1. Circuitry comprising:
    a power supply input terminal, a load output terminal, and a power node coupled between the power supply input terminal and the load output terminal;
    a first transistor having a first terminal, a second terminal, and a third gate terminal, the first terminal being coupled to the power supply input terminal and the second terminal being coupled to the power node;
    a second transistor having a fourth terminal, a fifth terminal, and a sixth gate terminal, the fourth terminal being coupled to the power node, and the fifth terminal being coupled to the load output terminal;
    a third transistor having a seventh terminal coupled to the power node, an eighth terminal coupled to a current sense node, and a ninth gate terminal coupled to the third gate terminal;
    a current limiting amplifier having a first input coupled to the power supply input terminal, a second input coupled to the power node, and an output coupled to the sixth gate terminal;
    a fourth transistor having a tenth terminal coupled to the current sense node, an eleventh terminal, and a twelfth gate terminal; and
    an operational amplifier having a first input coupled to a voltage reference, a second input coupled to the eleventh terminal, and an output coupled to the twelfth gate terminal.

2. The circuitry of claim 1 including a first resistor coupled between the power supply input terminal and the first input of the current limiting amplifier, and a second resistor coupled between the first resistor and the current sense node.

3. The circuitry of claim 2 in which the second resistor includes a third resistor and fourth resistor in a resistor ladder configuration.

4. The circuitry of claim 3 including a fast trip comparator circuit having a first input coupled the power node, a second input coupled to between the third resistor and the fourth resistor, and a fast trip output.

5. The circuitry of claim 1 including a current limit resistor coupled between the eleventh terminal and ground.

6. The circuitry of claim 1 in which the first transistor, the second transistor, and the third transistor are on an integrated circuit.

7. The circuitry of claim 1 in which the first, second, third, and fourth transistors are field effect transistors.

8. The circuitry of claim 1 in which the first, second, and third transistors are formed on one integrated circuit and the current limiting amplifier, the fourth transistor, and the operational amplifier are formed on a different integrated circuit.

* * * * *